US012628527B2

(12) United States Patent
Zhang et al.

(10) Patent No.: US 12,628,527 B2
(45) Date of Patent: May 12, 2026

(54) DISPLAY SUBSTRATE AND DISPLAY DEVICE WITH OPTIMIZED CHARGE-GENERATING LAYER

(71) Applicant: BOE TECHNOLOGY GROUP CO., LTD., Beijing (CN)

(72) Inventors: Can Zhang, Beijing (CN); Xiaochuan Chen, Beijing (CN); Dacheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 456 days.

(21) Appl. No.: 18/004,756

(22) PCT Filed: Feb. 17, 2022

(86) PCT No.: PCT/CN2022/076617
§ 371 (c)(1),
(2) Date: Jan. 9, 2023

(87) PCT Pub. No.: WO2023/155095
PCT Pub. Date: Aug. 24, 2023

(65) Prior Publication Data
US 2024/0251631 A1 Jul. 25, 2024

(51) Int. Cl.
*H10K 59/00* (2023.01)
*H10K 59/122* (2023.01)
*H10K 59/35* (2023.01)

(52) U.S. Cl.
CPC ......... *H10K 59/771* (2023.02); *H10K 59/122* (2023.02); *H10K 59/35* (2023.02)

(58) Field of Classification Search
CPC ..... H10K 59/771; H10K 59/122; H10K 59/35
See application file for complete search history.

(56) References Cited

U.S. PATENT DOCUMENTS

2015/0155513 A1 6/2015 Pieh et al.
2015/0214498 A1 7/2015 Ichikawa et al.
(Continued)

FOREIGN PATENT DOCUMENTS

CN 104810381 A 7/2015
CN 107068718 A 8/2017
(Continued)

OTHER PUBLICATIONS

Wang et al., CN_113921573_A_I, machine translation, Jan. 2022 (Year: 2022).*

(Continued)

*Primary Examiner* — Tracie Y Green
(74) *Attorney, Agent, or Firm* — Raj S. Davé; Davé Law Group, LLC

(57) ABSTRACT

An embodiment of the present disclosure provides a display substrate comprising a substrate comprising a display area and a peripheral area; a plurality of sub-pixels spaced apart by a pixel defining layer on the substrate and located in the display area, wherein the sub-pixels comprise: a first electrode; a first light-emitting layer; and a charge generating layer, wherein the pixel defining layer has a first opening exposing the first electrode, wherein an edge portion of the pixel defining layer adjacent to the first opening covers an edge portion of the first electrode, wherein the charge generating layer has a second opening, and an orthographic projection of the second opening on the substrate at least partially overlaps with an orthographic projection of the pixel defining layer on the substrate, wherein the charge generating layer has an edge portion adjacent to the second opening.

15 Claims, 4 Drawing Sheets

(56)       References Cited

U.S. PATENT DOCUMENTS

| 2019/0326542 A1 | 10/2019 | Yang et al. |
| 2020/0185469 A1 | 6/2020 | Kim et al. |
| 2022/0052136 A1 | 2/2022 | Wang et al. |

FOREIGN PATENT DOCUMENTS

| CN | 107389263 A | 11/2017 | | |
| CN | 110400822 A | 11/2019 | | |
| CN | 113451524 A | 9/2021 | | |
| CN | 113921573 A | 1/2022 | | |
| CN | 113972256 A | 1/2022 | | |
| JP | 2016-149368 A | 8/2016 | | |
| WO | WO-2021035418 A1 * | 3/2021 | ......... | H01L 27/3204 |
| WO | WO-2021203376 A1 * | 10/2021 | ......... | H01L 27/3218 |

OTHER PUBLICATIONS

Sun et al. CN_113972256_A_I, machine translation Jan. 2022 (Year: 2022).*

* cited by examiner

DISPLAY SUBSTRATE AND DISPLAY DEVICE WITH OPTIMIZED CHARGE-GENERATING LAYER

CROSS REFERENCE TO RELATED APPLICATIONS

This application claims a National Stage Entry of PCT/CN2022/076617, filed on Feb. 17, 2022, the disclosure of which is incorporated herein by reference herein in their entirety as part of the present application.

FIELD

The present disclosure relates to a field of display technology, and in particular, to a display substrate and a display device.

BACKGROUND

Virtual reality technology is widely used in various display devices. In order to make a displayed virtual reality scene free from graininess, a screen resolution (Pixel per inch, PPI) of the display device is generally greater than 2000 PPI. Since glass-based display devices have a smaller PPI, near-eye display devices based on virtual reality technology focus on silicon-based micro-displays (e.g., Micro-OLED, liquid crystal on silicon (LCOS), etc.). Compared with LCOS, Micro-OLED has many advantages, such as high contrast ratio and lower power consumption. Therefore, Micro-OLED is a hot research and development trend of silicon-based micro-displays.

SUMMARY

Embodiments of the present disclosure provide a display substrate and a display device.

According to a first aspect of the present disclosure, a display substrate is provided. The display substrate comprises: a substrate comprising a display area and a peripheral area located around the display area; a plurality of sub-pixels, on the substrate and located in the display area, spaced apart by a pixel defining layer, wherein the sub-pixels comprise: a first electrode located on the substrate; a first light-emitting layer located on the first electrode; and a charge generating layer located on the first light-emitting layer, wherein the pixel defining layer is located between the first electrode and the first light-emitting layer, and the pixel defining layer has a first opening exposing the first electrode, wherein an edge portion of the pixel defining layer adjacent to the first opening covers an edge portion of the first electrode, wherein the charge generating layer has a second opening, and an orthographic projection of the second opening on the substrate at least partially overlaps with an orthographic projection of the pixel defining layer on the substrate, wherein the charge generating layer has an edge portion adjacent to the second opening, an orthographic projection of the edge portion of the charge generating layer on the substrate overlaps with an orthographic projection of the pixel defining layer on the substrate and has a dimension greater than or equal to 0.01 μm and less than or equal to 0.5 μm in a direction parallel to the substrate.

In the embodiment of the present disclosure, the display substrate further comprises: a second light-emitting layer located on the charge generating layer; and a second electrode located on the second light-emitting layer, wherein an orthographic projection of the edge portion of the charge generating layer on the substrate overlaps with an orthographic projection of the pixel defining layer on the substrate and has a dimension greater than or equal to 0.1 μm and less than or equal to 0.2 μm in a direction parallel to the substrate.

In the embodiment of the present disclosure, the edge portion of the charge generating layer sequentially comprises a first edge portion and a second edge portion in a direction away from the first opening, a thickness of the first edge portion becomes gradually smaller toward the first opening.

In the embodiment of the present disclosure, a thickness of the first edge portion is smaller than a thickness of the second edge portion.

In the embodiment of the present disclosure, a slope angle of the first edge portion is greater than or equal to 40° and less than or equal to 70°.

In the embodiment of the present disclosure, a slope angle of the edge portion of the pixel defining layer is greater than or equal to 80° and less than or equal to 90°

In the embodiment of the present disclosure, the peripheral area comprises a wiring area and a cathode ring area located on at least on one side of the display area, which are arranged sequentially in a direction parallel to the substrate and away from the display area.

In the embodiment of the present disclosure, the peripheral area further comprises: a first dummy area surrounding the display area, and a second dummy area surrounding the cathode ring area, wherein the charge generating layer is also located in the first dummy area, the cathode ring area, and the second dummy area in the peripheral area of the substrate, and the second opening is not located in the first dummy area, the cathode ring area, and the second dummy area.

In the embodiment of the present disclosure, the sub-pixel comprises one of a red sub-pixel, a green sub-pixel, and a blue sub-pixel.

In the embodiment of the present disclosure, a portion of the charge generating layer between the red sub-pixel and the green sub-pixel does not have the second opening.

In the embodiment of the present disclosure, a portion of the charge generating layer between the red sub-pixel and the blue sub-pixel does not have the second opening.

In the embodiment of the present disclosure, the sub-pixel further comprises a hole injection layer and a first hole transport layer sequentially located between the first electrode and the first light-emitting layer, and a first electron transport layer located between the first light-emitting layer and the charge generating layer, a second hole transport layer located between the charge generating layer and the second light-emitting layer, and a second electron transport layer and an electron injection layer sequentially located between the second light-emitting layer and the second electrode.

In the embodiment of the present disclosure, the hole injection layer is located in the first opening and covers at least a part of the edge portion of the pixel defining layer.

In the embodiment of the present disclosure, the hole injection layer is located in the first opening and covers a top surface of the pixel defining layer located in the display area.

In the embodiment of the present disclosure, the first hole transport layer covers a surface of the pixel defining layer away from the substrate and a surface of the hole injection layer away from the substrate.

In the embodiment of the present disclosure, an orthographic projection of the hole injection layer on the substrate overlaps an orthographic projection of the charge generating layer on the substrate.

In the embodiment of the present disclosure, the second hole transport layer is located in the second opening and covers a surface of the charge generating layer away from the substrate.

According to a second aspect of the present disclosure, a display device is provided. The display device comprises a display substrate according to a second aspect of the present disclosure.

Further adaptive aspects and scope will become apparent from the description provided herein. It should be understood that various aspects of the present application may be implemented alone or in combination with one or more other aspects. It should also be understood that the description and specific embodiments herein are intended to be illustrative and not limiting the scope of this application.

BRIEF DESCRIPTION OF THE DRAWINGS

The drawings described herein are only for the purpose of illustrations of the selected embodiments rather than any possible implementation, and they are not intended to limit the scope of this application, in which.

DETAILED DESCRIPTION

Various embodiments will now be described in detail with reference to the accompanying drawings, provided as illustrative examples of the present disclosure so that those skilled in the art can practice the present disclosure.

It should be noted that the following figures and examples are not meant to limit the scope of the present disclosure. Where certain elements of the present disclosure can be implemented in part or in whole using known components (or methods or procedures), only those parts of such known components (or methods or procedures) necessary for an understanding of the present disclosure will be described, and detailed descriptions of other parts of such known components will be omitted so as not to obscure the present disclosure. Further, the various embodiments encompass, by way of illustration, present and future known equivalents to the components referred to herein.

Unless the context otherwise expressly indicates, terms used herein and in the appended claims include the plural and vice versa. Thus, when referring to the singular, it usually includes the plural of the corresponding term. Similarly, the terms "comprising", "including", "containing", "having" and their grammatical variations are intended to be inclusive and mean that there may be additional elements other than the listed elements. Where the term "example" is used herein, particularly when it follows a group of terms, the said "example" is exemplary and illustrative only, and should not be considered to be exclusive or broad. The terms "first", "second", "third", etc. are only used for the purpose of description, and cannot be understood as indicating or implying the relative importance and formation order.

Figures 1, 2:
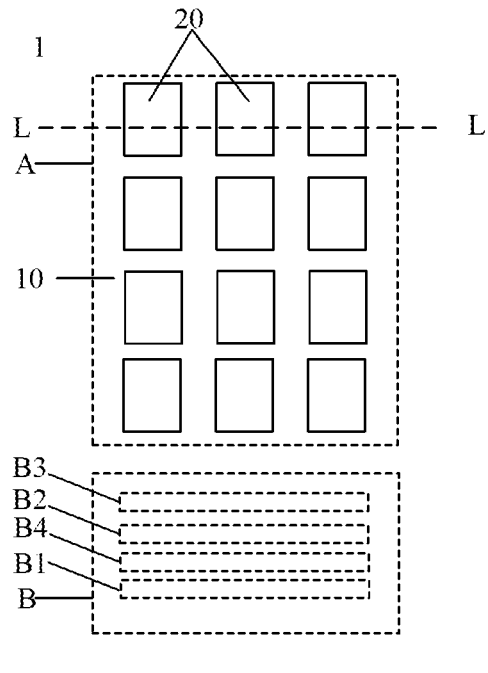
FIG. 1 illustrates a schematic diagram of a display substrate according to an embodiment of the present disclosure.
FIG. 2 illustrates a cross-sectional view of a display substrate according to an embodiment of the present disclosure.

FIG. 1 illustrates a schematic diagram of a display substrate according to an embodiment of the present disclosure. As shown in FIG. 1, the display substrate 1 includes a substrate 10 and a plurality of sub-pixels 20. The substrate 10 includes a display area A and a peripheral area B located around the display area A. The plurality of sub-pixels 20 are on the substrate 10 and are located in the display area A.

FIG. 2 illustrates a cross-sectional view of the display substrate shown in FIG. 1 at line LL according to an embodiment of the present disclosure. As shown in FIG. 2, the display substrate 1 includes a plurality of sub-pixels 20 (201, 202, 203), and the plurality of sub-pixels 20 are spaced by a pixel defining layer 30. The sub-pixel 20 at least includes: a first electrode 21 located on the substrate 10, a first light-emitting layer 22 located on the first electrode 21, a charge generating layer 23 located on the first light-emitting layer 22, a second light-emitting layer 24 located on the charge generating layer 23 and a second electrode 25 located on the second light-emitting layer 24.

In the embodiment shown in FIG. 2, the pixel defining layer 30 is located between the first electrode 21 and the first light-emitting layer 22, the pixel defining layer 30 has a first opening 301 exposing the first electrode 21, and an edge portion 302 of the pixel defining layer 30 adjacent to the first opening 301 covers an edge portion of the first electrode 21.

Further referring to FIG. 2, the charge generating layer 23 has a second opening 231, and the orthographic projection of the second opening 231 on the substrate 10 at least partially overlaps with the orthographic projection of the pixel defining layer 30 on the substrate 10. The charge generating layer 23 has an edge portion 232 adjacent to the second opening 231, the orthographic projection of the edge portion 232 on the substrate 10 at least partially overlaps with the orthographic projection of the pixel defining layer 30 on the substrate 10, and has a dimension greater than or equal to 0.01 μm and less than or equal to 0.5 μm in a direction parallel to the substrate 10. In an example of the present disclosure, the dimension of greater than or equal to 0.1 microns and less than or equal to 0.2 microns in the direction parallel to the substrate 10 may be provided.

In an embodiment of the present disclosure, the substrate may include a silicon substrate, such as a monocrystalline silicon wafer. The electrode material of the first electrode may include transparent conductive materials such as indium tin oxide. The material of the second electrode may include aluminum, magnesium or an alloy material formed of the two. The first light-emitting layer can be a yellow light-emitting layer, and the second light-emitting layer can be a blue light-emitting layer, so that the two can be mixed to produce white light. The charge generating layer can include an n-type charge generating layer and a p-type charge generating layer, wherein the n-type charge generating layer can include an organic material film layer containing doped metal lithium or a metal lithium layer, and the p-type charge generating layer can include the following one of the film layers: HAT-CN (Hexanitrile hexaazatriphenylene), tetracyanodimethyl-p-benzoquinone (TCNQ) and tetrafluorotetracyanodimethyl-p-benzoquinone (F4TCNQ).

With the display substrate according to an embodiment of the present disclosure, by making the orthographic projection of the edge portion of the charge generating layer on the substrate overlap at least partially with the orthographic projection of the pixel defining layer on the substrate, the area of the charge generating layer can be increased, thereby increasing the number of generated electrons and holes, and thereby improving the display effect.

In addition, the charge generating layer has a relatively high conductivity, by making the charge generating layer have the second opening, the lateral flow of current at the second opening can be blocked, and crosstalk between sub-pixels can be avoided.

It should be noted that the sub-pixels shown in FIG. 2 are arranged in a 3×4 array. It can be understood that those skilled in the art can arrange the sub-pixels in any suitable manner and number according to actual needs.

Further referring to FIG. 2, enlarged views of areas A and B are further shown at the bottom of FIG. 2. As shown in the enlarged view of the area A, the edge portion 232 of the charge generating layer 23 sequentially includes a first edge portion 232a and a second edge portion 232b in a direction away from the first opening 301 (i.e., along the X direction shown). The thickness of the first edge portion 232a gradually becomes smaller in a direction toward the first opening 301 (i.e., in the direction opposite to the X direction), and the thickness of the first edge portion 232a is smaller than that of the second edge portion 232b. The slope angle of the first edge portion 232a is α, and the slope angle α is greater than or equal to 40° and less than or equal to 70°. As shown in the enlarged view of the area B, the slope angle of the edge portion 302 of the pixel defining layer 30 is β, and the slope angle β is greater than or equal to 80° and less than or equal to 90°. In this application, the thickness refers to a distance of the film layer in the direction perpendicular to the substrate.

It should be noted that the slope angle α refers to, at an intersection line between the surface aa of the first edge portion 232a and a top surface bb of the non-edge portion 232c of the charge generating layer 23, an included angle between the top surface bb of the non-edge portion 232c and a tangent plane of the surface aa of the first edge portion 232a with the intersection line as a tangent line. The slope angle β refers to, at an intersection line between the surface cc of the edge portion 302 of the pixel defining layer 30 and the top surface dd of the first electrode 21, an included angle between a top surface dd of the first electrode 21 and a tangent plane of the surface c of the edge portion 302 with the intersection line as a tangent line.

Further referring to FIG. 1, the peripheral area B of the display substrate 1 may include a cathode ring area B2 and a wiring area B1 surrounding the display area A, which are arranged sequentially in a direction parallel to the substrate 10 and away from the display area A. The peripheral area B may further include a first dummy area B3 surrounding the display area A, and a second dummy area B4 surrounding the cathode ring area B2. Wherein, the display area A may be a rectangular area, and the first dummy area B3, the cathode ring area B2 and the second dummy area B4 surround the periphery of the display area A in sequence. The display area A can also be a rounded rectangle, a circle, a rectangle with an opening, or other shapes.

In an embodiment of the present disclosure, the charge generating layer may also be located in the first dummy area, the cathode ring area, and the second dummy area in the peripheral area of the substrate, and the second opening of the charge generating layer is not located in the first dummy area, the cathode ring area, and the second dummy area in the peripheral area. The manufacturing process of the display substrate can be simplified by not forming the second opening in the peripheral area.

Further referring to FIG. 2, the sub-pixel 20 further includes a color filter layer 26 on the second electrode 25.

In the embodiment shown in FIG. 2, sub-pixel 201 may be a red sub-pixel, sub-pixel 202 may be a green sub-pixel, and sub-pixel 203 may be a blue sub-pixel. Correspondingly, the color filter layer in the red sub-pixel is a red color filter layer, which may be formed of a photosensitive resin material containing a red pigment, and the color filter layer in the green sub-pixel is a green color filter layer, which may be formed of a photosensitive resin material containing a green pigment, the color filter layer in the blue sub-pixel is a blue color filter layer, which is formed of a photosensitive resin material containing a blue pigment, so that each sub-pixel emits light of different colors.

Figure 3:
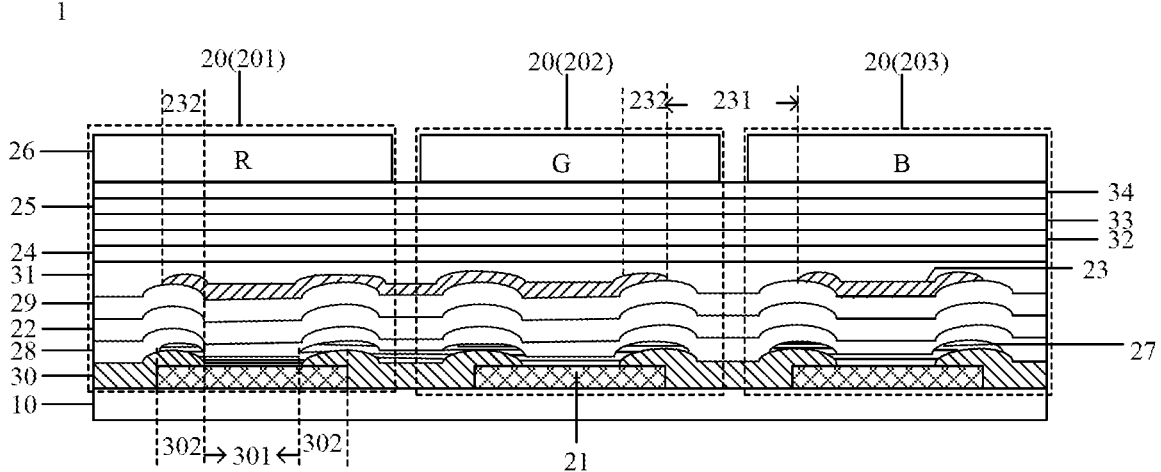
FIG. 3 illustrates a cross-sectional view of a display substrate according to another embodiment of the present disclosure.

FIG. 3 illustrates a cross-sectional view of a display substrate according to another embodiment of the present disclosure. As shown in FIG. 3, a portion of the charge generating layer 23 between the red sub-pixel 201 and the green sub-pixel 202 does not have the second opening 231.

Figure 4:
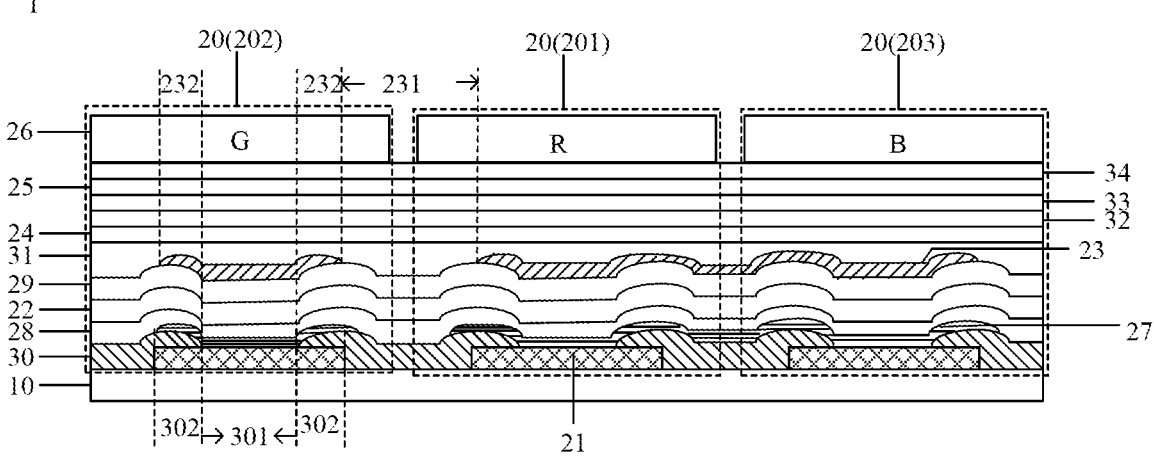
FIG. 4 illustrates a cross-sectional view of a display substrate according to yet another embodiment of the present disclosure.

FIG. 4 illustrates a cross-sectional view of a display substrate according to yet another embodiment of the present disclosure. As shown in FIG. 4, a portion of the charge generating layer 23 between the red sub-pixel 201 and the blue sub-pixel 203 does not have the second opening 231.

With the display substrate shown in FIG. 3, the red sub-pixel and the green sub-pixel share the same charge generating layer (that is, there is no second opening between the two sub-pixels), and with the display substrate shown in FIG. 4, the red sub-pixel and the blue sub-pixel share the same charge generating layer, which can simplify the manufacturing process of the display substrate.

It should be noted that other structures and/or functions of the display substrate shown in FIGS. 3 and 4 are similar to those shown in FIG. 2, and will not be described again here.

Further referring to FIG. 2, the sub-pixel 20 also includes a hole injection layer 27 and a first hole transport layer 28 sequentially located between the first electrode 21 and the first light-emitting layer 22, a first electron transport layer 29 located between the first light-emitting layer 22 and the charge generating layer 23, a second hole transport layer 31 located between the charge generating layer 23 and the second light-emitting layer 24, a second electron transport layer 32 and an electron injection layer 33 sequentially located between the second light-emitting layer 24 and the second electrode 25. In addition, the display substrate 1 further includes a thin film encapsulation layer 34 located between the second electrode 25 and the color filter layer 26.

Figure 5:
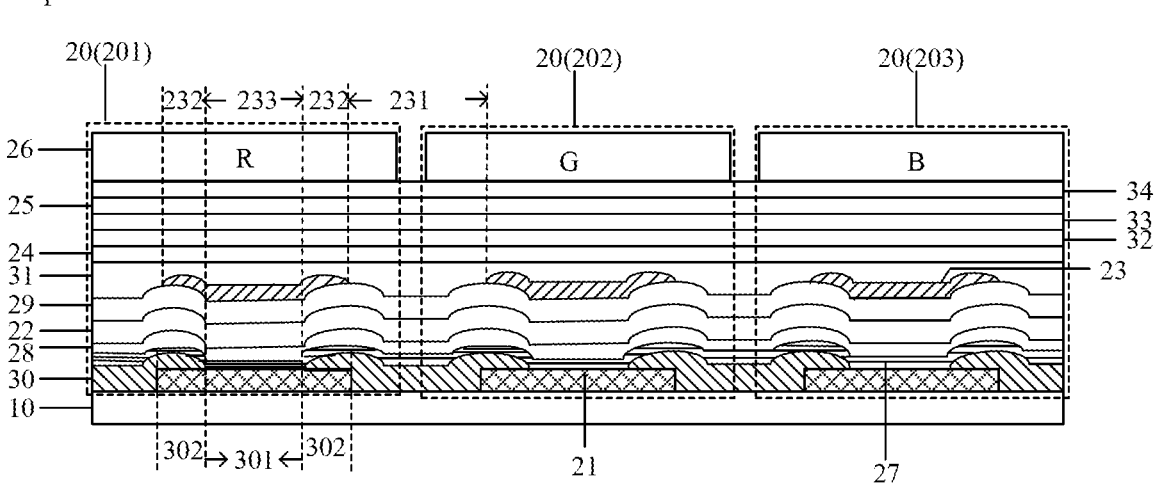
FIG. 5 illustrates a cross-sectional view of a display substrate according to yet another embodiment of the present disclosure.

In the embodiments shown in FIGS. 2, 3 and 4, the hole injection layer 27 may be located in the first opening 301 and cover at least a part of the edge portion 302 of the pixel defining layer 30. In other words, adjacent to the second opening 231, the orthographic projections of the pixel defining layer 30 and the hole injection layer 27 on the substrate 10 have at least a partially non-overlapping area. In the embodiments shown in FIGS. 2, 3 and 4, the orthographic projection of the hole injection layer 27 on the substrate 10 overlaps the orthographic projection of the charge generating layer 23 on the substrate 10. In another embodiment shown in FIG. 5, the hole injection layer 27 may be located in the first opening 301 and cover the top surface of the pixel defining layer 30 located in the display area. In other words, adjacent to the second opening 231, the orthographic projection of the pixel defining layer 30 on the substrate 10 overlaps with the orthographic projection of the hole injection layer 27 on the substrate 10. In the embodiments of the present disclosure, a same mask can be used to form the hole injection layer and the charge generating layer respectively, thereby saving the number of masks.

In an embodiment of the present disclosure, as shown in FIG. 2, the first hole transport layer 28 covers the surface of the pixel defining layer 30 away from the substrate 10 and the surface of the hole injection layer 27 away from the substrate 10. The second hole transport layer 31 is located in the second opening 231 and covers the surface of the charge generating layer 23 away from the substrate 10.

In an embodiment of the present disclosure, the thin film encapsulation layer may include a first inorganic encapsulation layer, an organic encapsulation layer and a second inorganic encapsulation layer sequentially stacked on the second electrode. The organic encapsulation layer may be located between adjacent first inorganic encapsulation layer and second inorganic encapsulation layer in order to achieve planarization and relieve stress between the inorganic encapsulation layers. The inorganic encapsulation layers can effectively block moisture and oxygen from the outside, and prevent material degradation caused by water and oxygen intrusion into the light-emitting layer.

In an embodiment of the present disclosure, the display substrate may further include a pixel driving circuit for driving each sub-pixel. The pixel driving circuit may include transistors and storage capacitors. Further, the transistor may be a thin film transistor, and the thin film transistor may be a top gate thin film transistor, a bottom gate thin film transistor or a double gate thin film transistor.

It can be understood that, among the respective transistors in the pixel driving circuit, the types of any two transistors may be the same or different. Exemplarily, in a pixel driving circuit, some transistors may be N-type transistors and some transistors may be P-type transistors. As another example, in a pixel driving circuit, the material of the active layer of some transistors may be low temperature polysilicon semiconductor material, and the material of the active layer of some transistors may be metal oxide semiconductor material.

Figure 6:
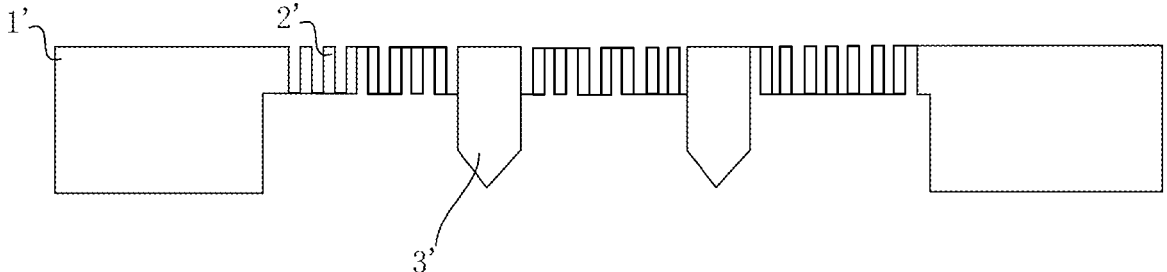
FIG. 6 illustrates a schematic diagram of a structure of a mask according to an embodiment of the disclosure.

In the embodiments of the present disclosure, the charge generating layer may be formed by evaporation using a mask. FIG. 6 shows a mask according to an embodiment of the present disclosure, which includes a body 1' and a mask pattern 2' formed on the body 1', the body 1' is made of a silicon base, and also includes a plurality of support structures 3' formed on the body 1', the plurality of support structures 3' are uniformly arranged on the body 1' and located in an area surrounded by the mask pattern 2', for supporting the body 1' and the mask pattern 2'.

In the above-mentioned mask, the mechanical strength of the silicon-based mask is increased by adding support structures 3' to the silicon-based mask for supporting the body 1' and the mask pattern 2', so that the reliability of the silicon-based mask is better during operation. The plurality of supporting structures 3' are uniformly arranged and located in the area surrounded by the mask pattern 2', which can ensure that their support force for the mask is uniformly distributed along the extension surface of the body 1'. In this way, the overall stress of the mask can be ensured to be uniform, so as to avoid the phenomenon that a certain position of the mask is broken due to excessive stress and sagging due to uneven stress, thus ensuring the better reliability of the mask.

Figure 7:
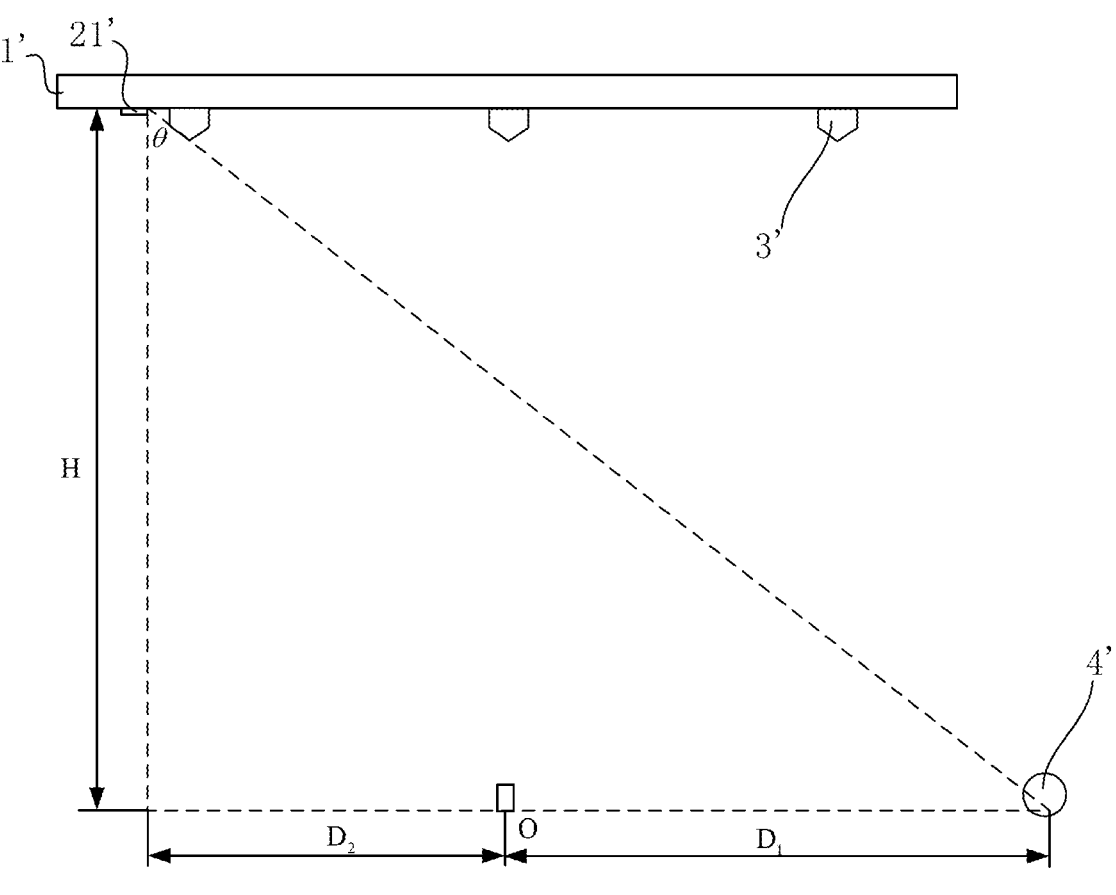
FIG. 7 illustrates a schematic diagram of a structure for a limit position of a set angular in a mask according to an embodiment of the disclosure.

On the basis of the above-mentioned mask, in order to ensure the uniformity of evaporation, specifically, as shown in FIG. 7, an end of the support structure 3' away from the mask pattern 2' is provided with a slope, and the slope is at a set angle with the direction of thickness of the body 1'.

In the above mask, by setting the end of the support structure 3' away from the mask pattern 2' as the slope, that is, with a certain angle, it is possible to prevent the support structures 3' from blocking the evaporation of the organic material during the evaporation process, and then it can ensure that the evaporation material can evenly pass through the mask pattern during evaporation process, thereby ensuring the uniformity of evaporation. In order to further ensure uniform evaporation, the end of the support structures 3' away from the mask pattern 2' is symmetrically provided with a slope, and the symmetrical slope are at the same set angle with the direction of thickness of the body 1'. The end of the support structure 3' away from the mask pattern 2' can be cylindrical, trapezoidal, or triangular. The specific shape can be determined according to the actual situation of the mask.

On the basis of the above mask, in order to further ensure the uniformity of evaporation, more specifically, as shown in FIG. 7, the set angle satisfies the following formula:

$$\tan \theta = H/(D_1 + D_2);$$

wherein $\theta$ is the set angle;

H is a distance from the evaporation source 4' to the mask;

$D_1$ is a distance from the evaporation source 4' to the central point O of the evaporation chamber;

$D_2$ is a distance from the pixel opening 21' corresponding to the mask pattern 2' closest to the support structure 3' to the central point O of the evaporation chamber.

In the above mask, the evaporation source 4' are arranged in the evaporation chamber along the circumferential direction, and in a right triangle with a connection line between the evaporation source 4' and the pixel opening 21' corresponding to the mask pattern 2' closest to the support structure 3' as hypotenuse. In order to ensure that the evaporation material sprayed from the evaporation source 4' can pass through the mask pattern 2' closest to the support structure 3, it is necessary to ensure that the corresponding support structure 3' will not block the spraying of the evaporation material. That is, the limit case is that the hypotenuse of the right triangle is just in contact with the slope, and the set angle is the same as the included angle between the right angle side of the right triangle and the direction of the thickness of the body I'. The set angle at this time can be calculated according to the formula $\tan \Theta = H/(D_1 + D_2)$. It is found that the $\Theta$ calculated by the above formula is the maximum set angle. When the set angle meets the above conditions, the evaporated material will not be blocked. The specific set angle in the design of the mask can be $\tan \Theta = H/(D_1 + D_2)$ smaller than the specific set angle calculated according to the formula. The set angle value can be determined according to the actual situation of the mask.

Figure 8:
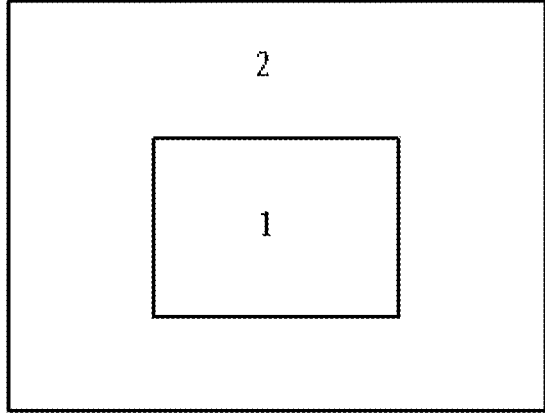
FIG. 8 illustrates a schematic diagram of a structure of a display device according to an embodiment of the present disclosure.

FIG. 8 illustrates a schematic diagram of the structure of a display device according to an embodiment of the present disclosure. As shown in FIG. 8, the display device 2 includes the display substrate 1 as described above. With the display device 2 according to the embodiment of the present disclosure, by at least partially overlapping the orthographic projection of the edge portion of the charge generating layer on the substrate with the orthographic projection of the pixel defining layer on the substrate, the area of the charge generating layer can be increased, thereby increasing the number of generated electrons and holes, thereby enhancing the display effect. In addition, the charge generating layer has a relatively high conductivity, and by making the charge generating layer have the second opening, the lateral flow of current at the second opening can be blocked, and crosstalk between sub-pixels can be avoided.

The foregoing description of the embodiments has been provided for purposes of illustration and description. It is not intended to be exhaustive or to limit the application. Individual elements or features of a particular embodiment are generally not limited to that particular embodiment, but, where appropriate, are interchangeable and can be used in a selected embodiment, even if not specifically shown or described. The same can also be changed in many ways. Such changes are not to be considered a departure from the application, and all such modifications are included within the scope of the application.

What is claimed is:

1. A display substrate, comprising:
a substrate comprising a display area and a peripheral area located around the display area;
a plurality of sub-pixels, on the substrate and located in the display area, spaced apart by a pixel defining layer, wherein the sub-pixels comprise:
a first electrode located on the substrate;
a first light-emitting layer located on the first electrode; and
a charge generating layer located on the first light-emitting layer,
wherein the pixel defining layer is located between the first electrode and the first light-emitting layer, and the pixel defining layer has a first opening exposing the first electrode, wherein an edge portion of the pixel defining layer adjacent to the first opening covers an edge portion of the first electrode,
wherein the charge generating layer has a second opening, and an orthographic projection of the second opening on the substrate at least partially overlaps with an orthographic projection of the pixel defining layer on the substrate,
wherein the charge generating layer has an edge portion adjacent to the second opening, an orthographic projection of the edge portion of the charge generating layer on the substrate overlaps with an orthographic projection of the pixel defining layer on the substrate and has a dimension greater than or equal to 0.01 $\mu$m and less than or equal to 0.5 $\mu$m in a direction parallel to the substrate,
wherein the edge portion of the charge generating layer sequentially comprises a first edge portion and a second edge portion in a direction away from the first opening, a thickness of the first edge portion becomes gradually smaller toward the first opening, wherein a slope angle of the first edge portion is greater than or equal to 40° and less than or equal to 70°, wherein a slope angle of the edge portion of the pixel defining layer is greater than or equal to 80° and less than or equal to 90°, wherein the peripheral area comprises a wiring area and a cathode ring area located on at least on one side of the display area, which are arranged sequentially in a direction parallel to the substrate and away from the display area, wherein the peripheral area further comprises: a first dummy area surrounding the display area, and a second dummy area surrounding the cathode ring area, wherein the charge generating layer is also located in the first dummy area, the cathode ring area, and the second dummy area in the peripheral area of the substrate, and the second opening is not located in the first dummy area, the cathode ring area, and the second dummy area.

2. The display substrate of claim 1, further comprising:
a second light-emitting layer located on the charge generating layer; and
a second electrode located on the second light-emitting layer,
wherein an orthographic projection of the edge portion of the charge generating layer on the substrate overlaps with an orthographic projection of the pixel defining layer on the substrate and has a dimension greater than or equal to 0.1 $\mu$m and less than or equal to 0.2 $\mu$m in a direction parallel to the substrate.

3. The display substrate of claim 1, wherein a thickness of the first edge portion is smaller than a thickness of the second edge portion.

4. The display substrate of claim 1, wherein the sub-pixel comprises one of a red sub-pixel, a green sub-pixel, and a blue sub-pixel.

5. The display substrate of claim 4, wherein a portion of the charge generating layer between the red sub-pixel and the green sub-pixel does not have the second opening.

6. The display substrate of claim 4, wherein a portion of the charge generating layer between the red sub-pixel and the blue sub-pixel does not have the second opening.

7. The display substrate of claim 2, wherein the sub-pixel further comprises a hole injection layer and a first hole transport layer sequentially located between the first electrode and the first light-emitting layer, a first electron transport layer located between the first light-emitting layer and the charge generating layer, a second hole transport layer located between the charge generating layer and the second light-emitting layer, and a second electron transport layer and an electron injection layer sequentially located between the second light-emitting layer and the second electrode.

8. The display substrate of claim 7, wherein the hole injection layer is located in the first opening and covers at least a part of the edge portion of the pixel defining layer.

9. The display substrate of claim 7, wherein the hole injection layer is located in the first opening and covers a top surface of the pixel defining layer located in the display area.

10. The display substrate of claim 7, wherein the first hole transport layer covers a surface of the pixel defining layer away from the substrate and a surface of the hole injection layer away from the substrate.

11. The display substrate of claim 7, wherein an orthographic projection of the hole injection layer on the substrate overlaps an orthographic projection of the charge generating layer on the substrate.

12. The display substrate of claim 7, wherein the second hole transport layer is located in the second opening and covers a surface of the charge generating layer away from the substrate.

13. A display device, comprising the display substrate of claim 1.

14. A display device, comprising the display substrate of claim 2.

15. A display device, comprising the display substrate of claim 3.

* * * * *